United States Patent
Hoshino et al.

(10) Patent No.: US 11,326,257 B2
(45) Date of Patent: May 10, 2022

(54) POLYCRYSTALLINE SILICON MANUFACTURING APPARATUS

(71) Applicant: Shin-Etsu Chemical Co., Ltd., Tokyo (JP)

(72) Inventors: Naruhiro Hoshino, Niigata (JP); Tetsuro Okada, Niigata (JP); Masahiko Ishida, Niigata (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 29 days.

(21) Appl. No.: 16/795,039

(22) Filed: Feb. 19, 2020

(65) Prior Publication Data

US 2020/0263304 A1    Aug. 20, 2020

(30) Foreign Application Priority Data

Feb. 20, 2019 (JP) .............................. JP2019-027952

(51) Int. Cl.
*C23C 16/46* (2006.01)
*C23C 16/24* (2006.01)

(52) U.S. Cl.
CPC .............. *C23C 16/46* (2013.01); *C23C 16/24* (2013.01)

(58) Field of Classification Search
CPC .............................. C01B 33/03; C01B 33/035
See application file for complete search history.

(56) References Cited

U.S. PATENT DOCUMENTS

| | | | | |
|---|---|---|---|---|
| 2,999,735 | A * | 9/1961 | Reuschel | C23C 16/06 423/350 |
| 2006/0196854 | A1* | 9/2006 | Severance | H05H 1/34 219/121.48 |
| 2009/0314207 | A1* | 12/2009 | Endoh | C01B 33/035 118/723 R |
| 2010/0122657 | A1* | 5/2010 | Hsieh | C23C 16/24 118/723 E |
| 2013/0011581 | A1 | 1/2013 | Muller et al. | |
| 2016/0280556 | A1* | 9/2016 | Park | B01J 19/087 |
| 2017/0306477 | A1* | 10/2017 | Kraus | C23C 16/46 |
| 2018/0208469 | A1* | 7/2018 | Rennschmid | C23C 16/46 |

FOREIGN PATENT DOCUMENTS

| | | | |
|---|---|---|---|
| CN | 201424378 Y | 3/2010 | |
| CN | 101565184 B | 12/2011 | |
| CN | 203034093 | * 7/2013 | ............. C23C 16/44 |
| CN | 203498097 U | 3/2014 | |
| JP | 2009221058 A | 10/2009 | |
| JP | 2010-30878 A | 2/2010 | |
| JP | 2013-18675 A | 1/2013 | |
| JP | 2018-502031 A | 1/2018 | |

OTHER PUBLICATIONS

Extended European Search Report dated Aug. 24, 2020, issued in counterpart EP Application No. 20151206 8. (7 pages).
Office Action dated Mar. 22, 2022, issued in counterpart JP Application No. 2019-027952, with English Translation. (6 pages).

* cited by examiner

*Primary Examiner* — Keath T Chen
(74) *Attorney, Agent, or Firm* — WHDA, LLP

(57) ABSTRACT

An integrated sleeve structure is provided between an electrode configured to feed power to a silicon core wire and a bottom plate part. Sealing members are arranged on at least part of a flange part of an insulating member and on at least part of a straight part of the insulating member.

3 Claims, 1 Drawing Sheet

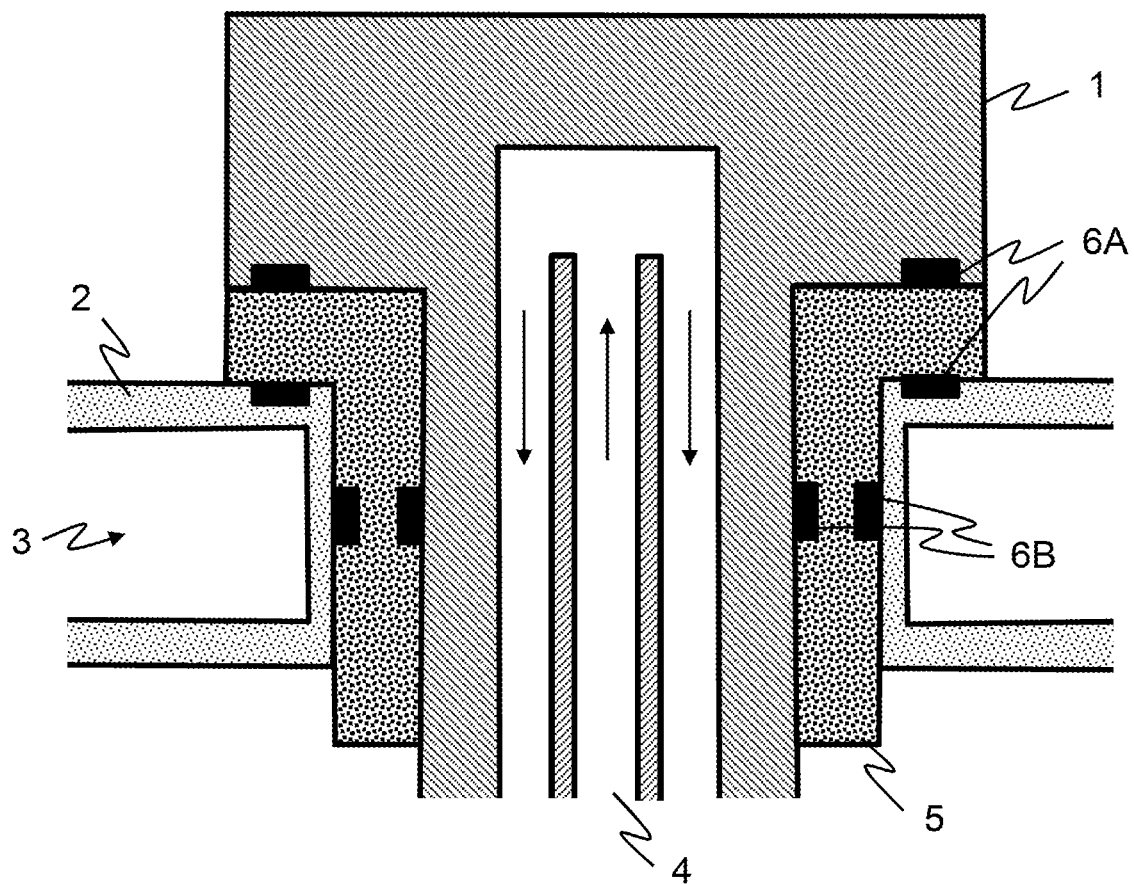

POLYCRYSTALLINE SILICON MANUFACTURING APPARATUS

TECHNICAL FIELD

The present invention relates to a polycrystalline silicon manufacturing apparatus, and more particularly to a structure of a polycrystalline silicon manufacturing apparatus having excellent sealability in a reactor and excellent insulation between an electrode and a bottom plate.

This application claims a priority of Japanese Patent Application No. 2019-027952 filed on Feb. 20, 2019 and incorporates all the contents of the application by reference.

BACKGROUND ART

Polycrystalline silicon is a raw material of monocrystalline silicon for semiconductor or solar cell silicon. As a method of manufacturing polycrystalline silicon, Siemens method is known. Siemens method is a method in which generally a silane source gas contacts a heated silicon core wire such that polycrystalline silicon is deposited on the surface of the silicon core wire using chemical vapor deposition (CVD) method.

In the Siemens method, two silicon core wires are set in a vertical direction and one silicon core wire is set in a horizontal direction to form a gate shape, both ends of the gate-shaped silicon core wires are connected to a core wire holder and fixed to a pair of metal electrodes arranged on a base plate. In general, a plurality of sets of gate-shaped silicon core wires is configured to be arranged in the reactor.

The gate-shaped silicon core wires are energized and heated to a deposition temperature of the polycrystalline silicon, and a mixture gas of, e.g., trichlorosilane and hydrogen, as a raw material gas, is brought into contact with the silicon core wires. Polycrystalline silicon is grown on the silicon core wires through vapor-phase epitaxy and a polycrystalline silicon rod having a desired radius is formed in an inverted U-shape.

The electrodes are inserted in through-holes in a bottom plate part (base plate) of the reactor. That is, between the electrodes and the bottom plate part, both sealability that isolates the space in the reactor and insulation performance between the electrodes and the bottom plate are required.

JP 2010-30878 A discloses a polycrystalline silicon manufacturing apparatus in which a through-hole in a bottom plate part in which an electrode holder is inserted is configured such that a lower part is a straight part and an upper part is a gradually expanding tapered part. With the polycrystalline silicon manufacturing apparatus with this configuration, an insulator that insulates the bottom plate part of the reactor from the electrodes can be protected from heat generated by reaction and a difference in thermal expansion can be absorbed. Furthermore, favorable insulation can be maintained. However, adopting such structure requires considerable remodeling of the apparatus, and there is a problem that the manufacturing cost increases.

Moreover, J P 2018-502031 A discloses a apparatus for insulating and sealing an electrode holder in a CVD reactor, the apparatus including an electrically insulating ring made of a material of construction, between the electrode holder and a floor plate, having a specific thermal conductivity at room temperature of 1 to 200 W/mK, a sustained use temperature of no less than 400° C., and a specific electrical resistance at room temperature of more than $10^9$ Ωcm. According to the inventors' study, it has been known that sufficient sealability and insulation performance cannot be obtained even with the electrically insulating ring.

DISCLOSURE OF INVENTION

The present invention was made in view of the aforementioned problem, and it is an object of the present invention to provide a technology of enabling an increase in sealability in a reactor of a polycrystalline silicon manufacturing apparatus and insulation between an electrode and a bottom plate without considerable remodeling of a conventional polycrystalline silicon manufacturing apparatus.

In order to resolve the problem, a polycrystalline silicon manufacturing apparatus in accordance with the present invention is a polycrystalline silicon manufacturing apparatus using Siemens method and comprises an insulating member having an integrated sleeve structure provided between an electrode configured to feed power to a silicon core wire and a bottom plate part, wherein the insulating member has a shape provided with a flange part at an upper part of a straight part, at least part of the flange part of the insulating member is fit between a lower surface of a flange part of the electrode and an upper surface of the bottom plate part, and at least part of the straight part of the insulating member is fit between a straight part of the electrode and a side surface of a through-hole part provided in the bottom plate part, and sealing members are arranged on at least two areas of the insulating member.

In an aspect, the sealing member may be arranged on at least part of the flange part of the insulating member and on at least part of the straight part of the insulating member respectively.

In an aspect, the sealing members may be arranged on two or more areas on at least part of the flange part of the insulating member. Similarly, in an aspect, the sealing members may be arranged on two or more areas on at least part of the straight part of the insulating member.

The present invention provides a technology of enabling an increase in sealability in a reactor of a polycrystalline silicon manufacturing apparatus and insulation between an electrode and a bottom plate without considerable remodeling of a conventional polycrystalline silicon manufacturing apparatus.

BRIEF DESCRIPTION OF DRAWINGS

FIG. 1 is a cross-sectional view for explaining an aspect of arrangement of an insulating member having an integrated sleeve structure and a sealing member of a polycrystalline silicon manufacturing apparatus according to the present invention.

DETAILED DESCRIPTION

An aspect example for carrying out the present invention is described below.

A conventional polycrystalline silicon manufacturing apparatus has an electrode structure having a column-shaped through-hole in a bottom plate part. The present inventors have conducted studies to increase sealability in a reactor and insulation between an electrode and a bottom plate without considerable remodeling of the bottom plate part, i.e., without considerable remodeling of the conventional polycrystalline silicon manufacturing apparatus.

When an electrode is fixed into the column-shaped through-hole, there is no other choice but to have an electrode shape having a flange part at an upper part of a straight part of the electrode. The electrode typically is provided with a coolant flow passage for suppression of an increase in temperature. However, cooling of the flange part provided at an upper part of the electrode is often insufficient in comparison with cooling of the straight part. As a result, the temperature of the flange part tends to be higher than that of the straight part.

JP 2018-502031 A discloses a apparatus with a structure in which the insulating ring is fit between the lower surface of a flange part of an electrode and the upper surface of a bottom plate part, and a sealing member is arranged on the insulating ring so as to exhibit the sealing function and the insulating function. However, as described above, because the temperature of the flange part of the electrode tends to be higher than that of the straight part, the sealing member arranged on that portion is set in an environment where the sealing member tends to be deteriorated. That is, it has been found that, in the long run, with the structure that is merely provided with a sealing member on a flange part of an electrode, it is difficult to sufficiently maintain the sealability due to deterioration of the sealing member.

Thus, the present inventors provide an insulating member having an integrated sleeve structure between an electrode for feeding power to a silicon core wire and a bottom plate part, and have studied arrangement of the sealing member to maintain sufficient sealability. It has been confirmed that the sealability is sufficiently maintained when the insulating member is arranged even at the flange part as long as it is in a close vicinity of the straight part.

FIG. 1 is a cross-sectional view for explaining an aspect of arrangement of the insulating member having the integrated sleeve structure and the sealing member included in a polycrystalline silicon manufacturing apparatus according to the present invention. In this drawing, reference numeral 1 denotes an electrode; 2, a bottom plate; 3, a bottom plate coolant flow passage; 4, an electrode coolant feed unit; 5, an integrated insulation sleeve; and 6A and 6B, a sealing member. Note that, in this drawing, the sealing members 6A and 6B are arranged respectively on at least part of a flange part of the insulating member (integrated insulation sleeve 5) and on at least part of a straight part of the insulating member. However, it is sufficient if the sealing members are arranged on at least two areas of the insulating member.

That is, the polycrystalline silicon manufacturing apparatus according to the present invention is a polycrystalline silicon manufacturing apparatus using the Siemens method including the insulating member having the integrated insulation sleeve between the electrode that feeds power to the silicon core wire and the bottom plate part, the insulating member having a shape provided with a flange part at an upper part of the straight part, at least part of the flange part of the insulating member is fit between the lower surface of the flange part of the electrode and the upper surface of the bottom plate part, at least part of the straight part of the insulating member is fit between the straight part of the electrode and a side surface of a through-hole part provided in the bottom plate part, and the sealing member is arranged on at least two areas of the insulating member.

Note that, as described above, the sealing members may be in an aspect in which the sealing members are arranged respectively on at least part of the flange part of the insulating member and on at least part of the straight part of the insulating member. Alternatively, the sealing members may be in an aspect in which the sealing members are arranged on two or more areas on at least part of the flange part of the insulating member or may be in an aspect in which the sealing members are arranged on two or more areas on at least part of the straight part of the insulating member.

The insulating member of the present invention has an integrated sleeve structure. This is because, in the case of a combination of a sealing member and an insulating sheath as disclosed in JP 2018-502031 A, the sealability is reduced between the members, and there is a possibility that sufficient sealability cannot be ensured as a whole.

Note that when the sealing member is arranged on at least part of the straight part of the insulating member, the sealing member is arranged in a portion of the through-hole of the bottom plate part. However, this portion is not directly subject to heat radiation in the reactor. Therefore, the sealing member is likely to maintain the initial sealability over a relatively long period of time.

Example

Trichlorosilane was used as a raw material to develop a polycrystalline silicon rod having an inverted U-shape using the Siemens method. The growth was performed to have a diameter of about 120 mm to 160 mm. In each embodiment, polycrystalline silicon rods were set on six electrodes in a reactor, and this was continued for a year. The specs and results of the embodiments are illustrated in Table 1.

In an embodiment of Comparative Example 1, the sealability could not be maintained for a year. Therefore, the sealing member was replaced at a time when defect was confirmed. Meanwhile, the electrodes of the other embodiments were left as they were, and the results of a total of one year were obtained.

In Comparative Example 2, there was no leakage of gas to the outside of the reactor. However, deterioration of the sealing members on all areas was confirmed, and it was considered that Comparative Example 2 lacked long-term stability.

In Example 1, there was no leakage of gas to the outside of the reactor. However, slight deterioration of the sealing members on an inner side of the flange part was confirmed.

In Example 2, there was no leakage of gas to the outside of the reactor. Deterioration of the other sealing members was not confirmed.

TABLE 1

|  | Comparative Example 1 | Comparative Example 2 | Example 1 | Example 2 |
|---|---|---|---|---|
| Sleeve structure | Integrated | Separate | Integrated | Integrated |
| Seal position | Flange part only | Flange part & straight part | Two areas on flange part | Flange part & straight part |
| Result | Presence of detection of reactor gas outside of reactor within one year | Absence of detection of reactor gas outside of reactor within one year | Absence of detection of reactor gas outside of reactor within one year | Absence of detection of reactor gas outside of reactor within one year |
| Sealing member Evaluation | Confirmation of deterioration of electrode-side sealing member | Significant deterioration of electrode-side sealing member of flange part, and presence of deterioration of all the | Significant deterioration of electrode-side sealing member of flange part, and presence of slight deterioration of the inner | Deterioration of electrode-side sealing member of flange part, and absence of deterioration of the other sealing |

TABLE 1-continued

| | Comparative Example 1 | Comparative Example 2 | Example 1 | Example 2 |
|---|---|---|---|---|
| | | other sealing members | seal | members 5 |

From the above results, it is considered that an increase in number of sealing members enables long-term stability of the sealability, but an optimum number can be properly selected in terms of cost.

The present invention provides a technology of enabling an increase in sealability in a reactor of a polycrystalline silicon manufacturing apparatus and insulation between an electrode and a bottom plate.

1 electrode
2 bottom plate
3 bottom plate coolant flow passage
4 electrode coolant feed unit
5 integrated insulation sleeve
6A, 6B Sealing member

The invention claimed is:

1. A polycrystalline silicon manufacturing apparatus, using Siemens method, comprising:
   an insulating member having an integrated sleeve structure provided between an electrode configured to feed power to a silicon core wire and a bottom plate part, wherein
   the insulating member has a shape provided with a flange part at an upper part of a straight part,
   at least part of the flange part of the insulating member is fit between a lower surface of a flange part of the electrode and an upper surface of the bottom plate part, and at least part of the straight part of the insulating member is fit between a straight part of the electrode and a side surface of a through-hole part provided in the bottom plate part,
   sealing members are arranged on two or more areas on at least part of the straight part of the insulating member, and
   one of the sealing members is arranged between a side surface of the straight part of the electrode and an inner side surface of the straight part of the insulating member, and another one of the sealing members is arranged between the side surface of the through-hole part and an outer side surface of the straight part of the insulating member, and the one of the sealing members is positioned at the same height level as the another one of the sealing members with the straight part of the insulating member therebetween.

2. The polycrystalline silicon manufacturing apparatus according to claim 1, wherein the sealing member are arranged on at least part of the flange part of the insulating member and on at least part of the straight part of the insulating member respectively.

3. The polycrystalline silicon manufacturing apparatus according to claim 1, wherein the sealing members are arranged on two or more areas on at least part of the flange part of the insulating member.

* * * * *